United States Patent [19]

Matsushita et al.

[11] Patent Number: 4,675,634
[45] Date of Patent: Jun. 23, 1987

[54] VARIABLE-CAPACITANCE TUNING CIRCUIT FOR HIGH-FREQUENCY SIGNALS

[75] Inventors: Seiji Matsushita, Aichi; Akira Fujishima, Ichinomiya; Isao Arika, Aichi; Joji Nakamura, Inazawa, all of Japan

[73] Assignee: Matsushita Electric Industrial Co., Ltd., Osaka, Japan

[21] Appl. No.: 763,190

[22] Filed: Aug. 7, 1985

[30] Foreign Application Priority Data

Aug. 16, 1984 [JP] Japan .................. 59-170608

[51] Int. Cl.$^4$ ................................ H03J 3/18
[52] U.S. Cl. ........................... 334/15; 455/195
[58] Field of Search .............. 334/15; 307/320; 331/36 C, 177 V; 455/195

[56] References Cited

U.S. PATENT DOCUMENTS 3,624,514 11/1971 Putzer ........................ 334/15 X
3,662,287 5/1972 Egbert et al. .................. 334/15 X
3,753,172 8/1973 Sakamoto ....................... 334/15
3,889,210 6/1975 Matsuura et al. ............... 334/15 X

FOREIGN PATENT DOCUMENTS 28677 2/1980 Japan .................. 331/177 V
95418 6/1983 Japan .

OTHER PUBLICATIONS

Jelesiewicz, *Parallel Varactor Diode Frequency Multiplier*, RCA Technical Notes, RCA TN No. 650, Nov. 1965.

*Primary Examiner*—Paul Gensler
*Attorney, Agent, or Firm*—Spencer & Frank

[57] ABSTRACT

In a variable capacitance tuning circuit for high-frequency signals, a first varactor diode is connected between either the receiving end or feeding end and ground, one end of a tuning coil is connected to the receiving end or feeding end, and a second varactor diode is connected between the other end of the tuning coil and ground.

9 Claims, 14 Drawing Figures

VARIABLE-CAPACITANCE TUNING CIRCUIT FOR HIGH-FREQUENCY SIGNALS

BACKGROUND OF THE INVENTION

This invention relates to a variable capacitance tuning circuit for high-frequency signals which is used in a television receiver, has excellent interference-eliminating ability and noise characteristics, and can tune to multiple channels.

Description will be made of a tuner for receiving multiple channels of television including cable television.

In North America or European countries such as Belgium, multi-channel cable television has been developed and now the number of broadcast channels is increasing. Thus, since the number of VHF channels to be received by a television tuner is increasing it is now necessary to use a high-performance television tuner capable of receiving more channels.

A television tuner capable of tuning to multiple channels is constructed as shown in FIG. 1. In this figure, A represents an antenna tuning circuit for receiving predetermined frequencies of antenna signals, B an RF amplifier, C an interstage double tuning circuit and D a mixer circuit.

In addition, 1 represents a VHF antenna input terminal, 2 a band-I tuning coil in the antenna circuit, 3 a band-II tuning coil therein, 4 a band-III tuning coil therein, 5 a varactor diode, 6 another varactor diode, 7 a switch circuit, 8 an amplifying MOS-FET, 9 an interstage primary band-I tuning coil, 10 an interstage secondary band-I tuning coil, 11 an interstage primary band-II tuning coil, 12 an interstage secondary band-II tuning coil, 13 an interstage primary band-III tuning coil, 14 an interstage secondary band-III tuning coil, 15 a mixing MOS-FET and 16 a tuning circuit.

FIG. 2 shows the tuning circuit extracted from FIG. 1. A receiving end or feeding end 17 is connected to the junction between the varactor diodes 5 and 6. This junction is connected to a BT terminal, that is, a terminal to which a D.C. tuning voltage is applied to change the capacitance value of the varactor diodes 5 and 6 thereby changing the resonant frequency of the tuning circuit.

This tuning circuit, however, has too small a variable capacitance to tune to more channels. Thus, it is necessary to develop a television tuning circuit capable of tuning to multiple channels.

Also, as compared with the tuner for receiving 12 VHF channels or so, it is difficult with this tuning circuit to add an image frequency trap for reception of multiple channels and thus it has a poor image interference ratio. It is also desired to use a tuning circuit which has an excellent noise figure.

SUMMARY OF THE INVENTION

Accordingly, it is an object of this invention to provide a tuning circuit which can increase the number of channels to be received and be improved in selectivity, thereby obviating the drawbacks of the conventional tuning circuit for a television tuner.

It is another object of this invention to provide a tuning circuit which has an improved noise characteristic.

According to this invention, there is provided a variable capacitance tuning circuit for high frequency signals comprising two varactor diodes each having one end grounded, and a tuning coil connected between the other ends of the varactor diodes.

BRIEF DESCRIPTION OF THE DRAWINGS

This invention will become more readily understood from the following exemplary description taken with reference to accompanying drawings, in which.

DESCRIPTION OF THE PREFERRED EMBODIMENT

Figure 3A:
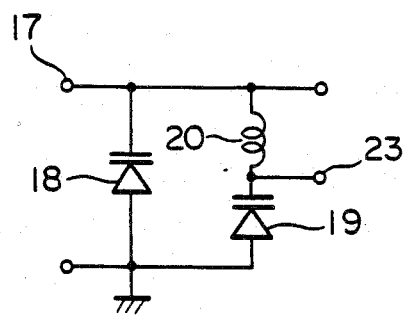
FIGS. 3A and 3B are circuit diagrams of embodiments of a variable capacitance tuning circuits for reception of high frequency signals according to this invention.

FIG. 3A is a circuit diagram of one embodiment of this invention. The tuning circuit of this embodiment shown in FIG. 3A is composed of varactor diodes 18 and 19 and a tuning coil 20. One end of each of the varactor diodes 18 and 19 is grounded and the tuning coil 20 is connected between the other ends of the varactor diodes 18 and 19.

Figure 3B:
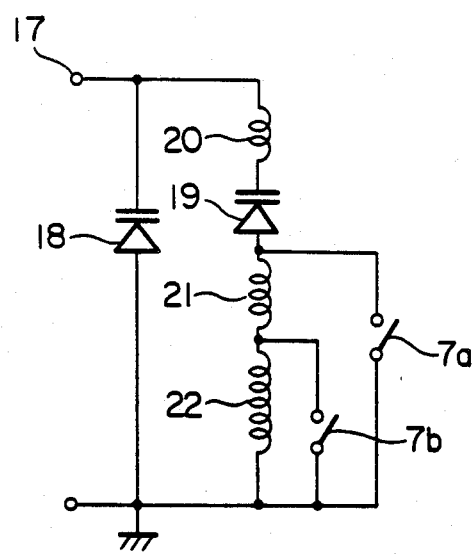

FIG. 3B is a circuit diagram of another embodiment of this invention which is capable of serving as a 2-band or 3-band tuning circuit by operating a circuit consisting of switching circuits 7a and 7b.

As shown in FIG. 3B, the receiving end or feeding end 17 is connected to one end of the varactor diode 18 and the ground-side end of the other varactor diode 19 is connected to ground through tuning coils 21 and 22 for the second and third bands. The other end of the varactor diode 19 is connected through the tuning coil 20 for the first band to the one end of the varactor diode 18. The switching circuit 7a is used for the firstband tuning and the switching circuit 7b for the second band tuning.

Figure 2:
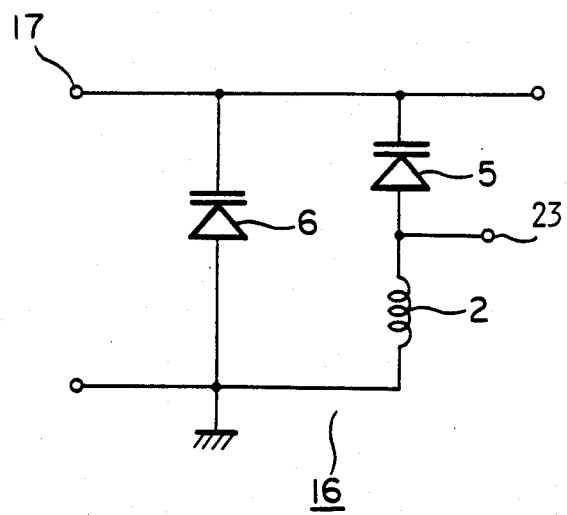
FIG. 2 is a circuit diagram of a conventional tuning circuit.

The embodiment of this invention shown in FIG. 3A will be compared with the conventional example of FIG. 2.

[Variable capacitance ratio]

When a tuning circuit is built or incorporated in apparatus, added thereto is
(1) the capacitance of a circuit connected to the receiving end or feeding end 17,
(2) the capacitance between elements, and
(3) the capacitance between the junctions of connected elements and ground.

These capacitances reduce the variable capacitance ratio of the tuning circuit of an electronic tuner.

Here, if the conventional circuit of FIG. 2 is compared with the tuning circuit of the invention shown in FIG. 3A, it will be found that the three capacitance values (1), (2) and (3) in the invention are respectively the same as those in the conventional circuit. However, the capacitance values between the terminal 23 and ground in the tuning circuits of FIGS. 2 and 3A, or the capacitance values (3) differently affect the variable capacitance ratios of the tuning circuits, respectively.

Figure 4A:
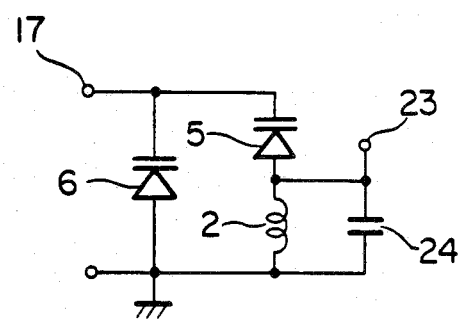
FIGS. 4A and 4B are respectively equivalent circuit diagrams of a conventional tuning circuit and a tuning circuit of the invention with a capacitance $C_b$ connected between the junction of elements of the tuning circuits and ground.
Figure 4B:
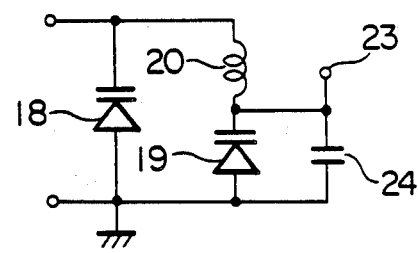

If the capacitance value between the terminal 23 and ground is represented by $C_b$, the equivalent circuits of FIGS. 2 and 3A are shown in FIGS. 4A and 4B, respectively. A capacitor 24 has this capacitance $C_b$.

The variable capacitance ratio, NA of the tuning circuit of FIG. 2, when the two varactor diodes are the same, is given as $$NA = \frac{2C_b + CL}{2C_b + CH}$$

where CL is the capacitance across the varactor diodes 5 and 6 in FIG. 4A when a minimum voltage is applied thereacross, and CH is that when a maximum voltage is applied thereacross.

Since the relation between CL and CH is approximately constant, it can be expressed as CL = n CH Thus, the variable capacitance ratio NA can be given by $$NA = \frac{2C_b + n\ CH}{2C_b + CH}$$

The variable capacitance ratio, NB in the tuning circuit of this invention shown in FIG. 3A can be expressed as $$NB = \frac{n\ CH(C_b + n\ CH)/(C_b + 2n\ CH)}{CH(C_b + CH)/(C_b + 2CH)}$$

Here, the ratio, NB/NA can be calculated by assuming that n CH >> $C_b$, as $$\frac{NB}{NA} = 1 + \frac{C_b}{CH} + \frac{C_b}{2(C_b + CH)} > 1$$

Thus, NB > NA. This means that the tuning circuit of FIG. 3A has a larger variable capacitance ratio than that of FIG. 2, or can change the tuning frequency over a wider range in which more reception channels can be set.

[Selectivity characteristic]

Similarly when a tuning circuit is built or incorporated in apparatus, particularly in a printed wiring board widely used, added thereto is (1) the conductance of a circuit connected to the receiving end or feeding end,
(2) the conductance between elements, and
(3) the conductance between an element and ground, and these conductances reduces the sharpness of resonance, that is, the Q of the tuning circuit.

Here, if the conventional circuit of FIG. 2 is compared with the tuning circuit of the invention shown in FIG. 3A, it will be found that the three conductances (1), (2) and (3) in the invention are respectively the same as those in the conventional circuit. However, the conductance values between the terminal 23 and ground in the tuning circuit of FIGS. 2 and 3A differently affect the Q of the tuning circuits, respectively.

Figure 5A:
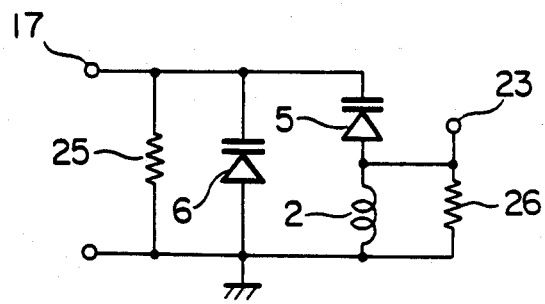
FIGS. 5A and 5B are respectively other equivalent circuit diagrams of the conventional circuit and the circuit of the invention.
Figure 5B:
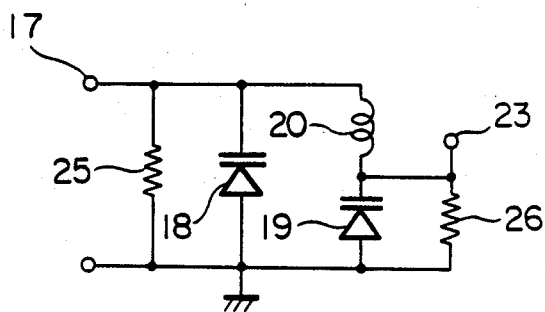

If the conductance between the terminal 23 and ground in the tuning circuits of FIGS. 2 and 3A is represented by g and the other conductances by G, the equivalent circuits are respectively shown in FIGS. 5A and 5B.

In FIGS. 5A and 5B, 25 represents the conductance of a circuit connected to the receiving end or feeding end 17, the conductance across the element and the conductance between the junction of elements and ground, and 26 the conductance between the terminal 23 and ground.

The admittance, YA of the conventional tuning circuit of FIG. 5A when viewing from the receiving end or feeding terminal 17 can be expressed as $$YA = G + \frac{\omega^4 gL^2C^2}{(1 - \omega^2 LC)^2 + (\omega gL)^2} +$$

$$j\omega C \left\{ 1 + \frac{1 - \omega^2 LC + \omega^2 g^2 L^2}{(1 - \omega^2 LC)^2 + (\omega gL)^2} \right\}$$

The real part, GAO of the admittance YAO at the tuning frequency, $\omega_o$ is re-arranged by substituting $\omega_o = (2/LC)$ into the above expression, as $$GAO = G + \frac{4\omega_o^4 gC^2}{\omega_o^4 C^2 + 4\omega_o^2 g^2}$$

Also, the admittance, YB of the tuning circuit of FIG. 5B when viewing from the receiving end or feeding end 17 can be expressed as $$YB = G + \frac{g}{(1 - \omega^2 LC)^2 + (\omega gL)^2} +$$

$$j\omega \left\{ C + \frac{C - g^2 L - \omega^2 LC}{(1 - \omega^2 LC)^2 + (\omega gL)^2} \right\}$$

The real part, GBO of the admittance YBO at the tuning frequency $\omega_o$ can be determined as $$GBO = G + \frac{\omega_o^4 gC^2}{\omega_o^4 C^2 + 4\omega_o^2 g^2}$$

Thus, GAO—GBO is calculated as $$GAO - GBO = \frac{3\omega_o^4 gC^2}{\omega_o^4 C^2 + 4\omega_o^2 g^2} > 0$$

Thus, GAO>GBO, or the Q of the tuning circuit of this invention is higher than that of the conventional tuning circuit and hence has much better selectivity.

This means that its loss is small and that the noise characteristic is better.

Figure 1:
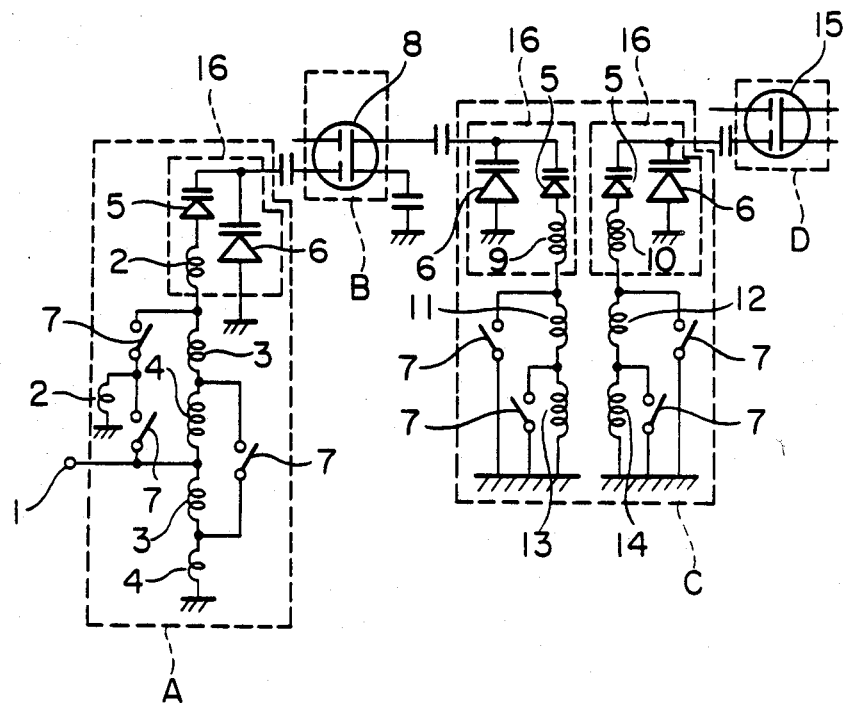
FIG. 1 is a circuit diagram of a conventional electronic tuner for tuning to multiple channels.
Figure 6:
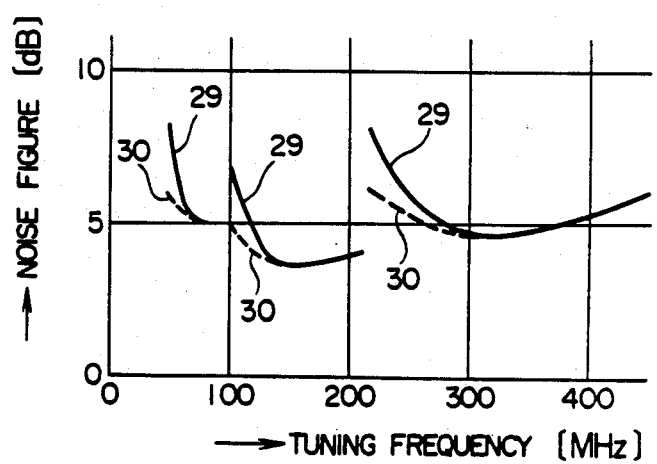
FIG. 6 is a graph of the figure of a multi-channel receiving electronic tuner.
Figure 7:
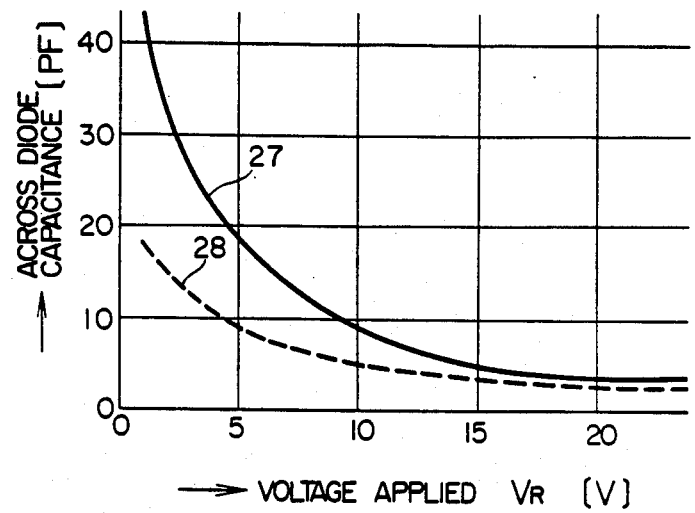
FIG. 7 is a graph of voltage vs. capacitance across a varactor diode.

In a television tuner circuit, an RF amplifier or a mixer circuit is connected to the receiving terminal or feeding terminal of the tuning circuit as shown in FIG. 1. Also, a MOS-FET is used in this RF amplifier or mixer circuit since it has an excellent cross modulation characteristic and is thus widely used at present. On the other hand, measurement was made of the noise figures of tuners in which the tuning circuits respectively employ for the diodes 18 of FIG. 3A and 3B a large variable capacitance ratio varactor diode having $$N = \frac{\text{Capacitance value thereacross when 3 } V \text{ is applied}}{\text{Capacitance value thereacross when 25 } V \text{ is applied}} \approx 9,$$

and called a Hi-N ratio varactor diode as shown in FIG. 7 by curve 27) and a varactor diode of about half the large variable capacitance ratio (having N=5 and called the normal N ratio varactor diode as shown in FIG. 7 by curve 28). FIG. 6 shows the measured results, in which 29 represents the noise characteristic of the tuner using the Hi-N ratio varactor diode, and 30 the noise characteristic of the tuner using the normal N ratio varactor diode as the diode 18 connected to the receiving end or feeding end 17. From FIG. 6, it will be seen that the tuner including the tuning circuit in which the normal N ratio varactor diode is used is improved about 2 dB at the low end channels of each frequency band.

Figure 8:
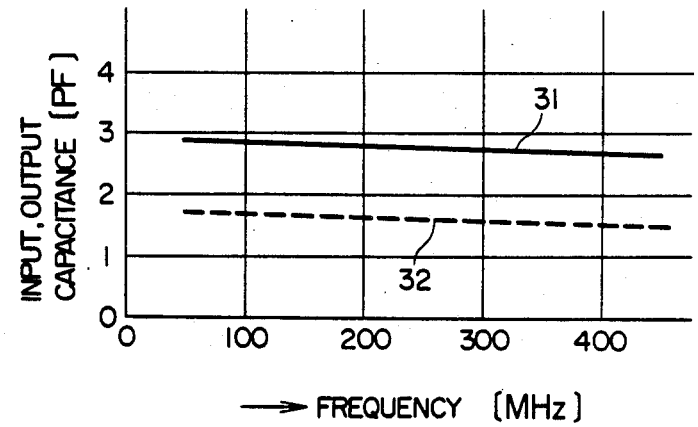
FIG. 8 is a graph of frequency vs. input/output capacitances of a MOS-FET.

This is because as shown in FIG. 7 the capacitances across the Hi-N ratio and normal N ratio varactor diodes differ at a particularly low voltage applied thereacross. That is, the capacitances of the Hi-N ratio and normal N ratio varactor diodes when one volt is applied thereacross are respectively about 40 pF and 20 pF, or the former is about twice the latter. On the other hand, the input and output capacitance, 31 of the MOS-FET (for example, shown in FIG. 1 by 8) is about 1 to 6 pF as shown in FIG. 8. Thus, the FET mismatches the tuning circuit, so that a mismatching loss occurs, reducing the noise figure. The curve, 32 in FIG. 8 shows the output capacitance characteristic of the MOS-FET.

Thus, it seems better to use the normal N ratio varactor diode for each of the two varactor diodes 18 and 19 in the tuning circuit, but the variable capacitance ratio of the tuning circuit is inevitably reduced to about a half, which disables the reception of multiple channels.

Therefore, when the normal N ratio varactor diode is used for the varactor diodes 18 in FIGS. 3A and 3B and when the Hi-N ratio varactor diode is used for the varactor diodes 19 in FIGS. 3A and 3B, the variable capacitance ratio can be considerably prevented from decreasing and the tuning circuit has an excellent noise figure.

The variable capacitance ratio of the varactor diode 18 is not so reduced because the capacitance of a circuit to be connected to the receiving end or feeding end 17 is added to the diode 18.

In other words, a relatively large capacitance ratio varactor diode for reception of multiple channels is used as the varactor diode 19 and a relatively small variable capacitance ratio varactor diode for improvement of noise characteristic is used as the varactor diode 18. This permits realization of a multi-channel-receiving tuning circuit having excellent noise and selectivity characteristics.

Figure 9:
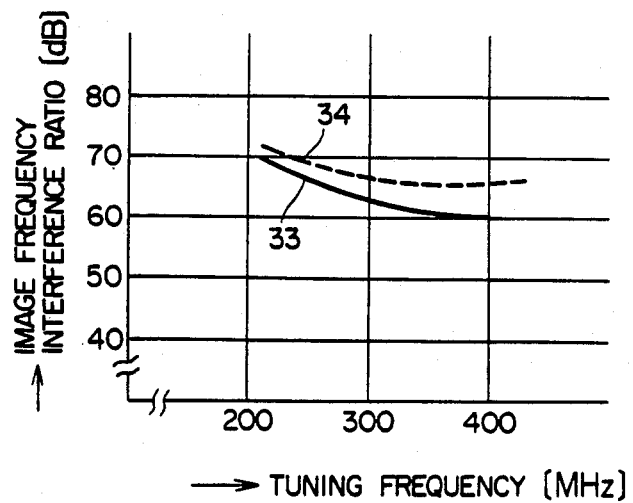
FIG. 9 is a graph of frequency vs. image frequency interference ratio of an electronic tuner.

When the tuning circuit of this invention is used in a multi-channel cable television tuner, it can result in greater improvement in the tuner than the conventional tuning circuit of FIG. 2; that is, 5 channels (30 MHz) can be added to the Super and Hyper bands of which the maximum channels to be received are over 210 MHz, and the selectivity can be improved. Thus, as shown in FIG. 9, the image frequency interference ratio in this invention indicated by curve 33 is 6 dB lower than that of the conventional circuit indicated by curve 34. This can permit coping with a future increase in the number of channels.

Also, if this tuning circuit of the invention is used for the same number of channels to be received as the conventional tuning circuit of FIG. 2, the loss is low because of its high Q and the variable capacitance ratio becomes large. Thus, the tuning voltage to the low-end channel can be increased when the same tuning voltage to the high end channel is used, thereby increasing the noise characteristic by 1.5 dB.

Figure 10:
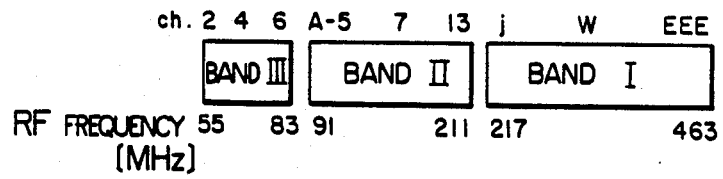
FIG. 10 is a diagram useful for explaining the VHF channels to be received by a 139-channel electronic tuner for the television of North America.

Thus, when a varactor diode of smaller variable capacitance ratio is used for the diode connected to the receiving end or feeding end in the tuning circuit of this invention, this tuning circuit enables the realization of an electronic tuner of 139 channels (of which the number of VHF channels is 69) for cable television in North America which tuner is excellent in noise characteristic and selectivity and constructed in a VHF one-series 3-band system. FIG. 10 shows the channels and bands to be received by this tuner.

Figure 11:
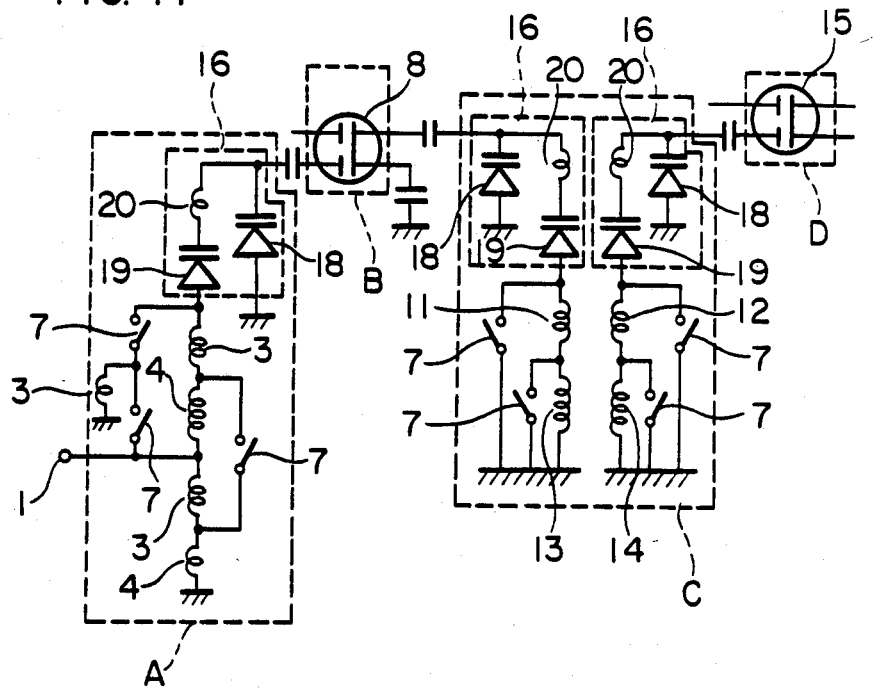
FIG. 11 is a circuit diagram of the 139-channel electronic tuner for the television of North America in which an antenna and an interstage double tuning circuit are connected.

FIG. 11 is a circuit diagram of the 139-channel electronic tuner using the tuning circuit of this invention.

According to a tuning circuit of this invention, a multi-channel receiving television tuner which excels in the following points as compared with that using the conventional tuning circuit can be produced and contribute to the development of the multi-channel cable television industry:

(1) The large variable capacitance ratio of the tuning circuit can cope with a future increase in the number of cable television channels.

(2) The high Q of the tuning circuit can improve the selectivity, and reduce the channel interference and image frequency interference which often appear particularly in the multi-channel reception. In addition, since the noise characteristic is excellent, interference phenomena scarcely occur and thus clearer video images can be reproduced.

(3) A high performance tuner capable of clearly receiving video channels from 54 MHz to 470 MHz in the North America cable television can be produced in one series 3-band structure having a smaller number of parts than one-series 4-band or 2-series 3-band structure and therefore can be small in size. This results in a reduced number of parts in television receivers. Thus the size of television receivers is reduced.

We claim:

1. A high-frequency signal receiving variable-capacitance tuning circuit comprising a first varactor diode connected between either one of a receiving end and a feeding end and ground, a tuning coil having one end connected to said receiving end or feeding end, and a second varactor diode connected between the other end of said tuning coil and ground, said first varactor diode having a variable capacitance ratio smaller than that of said second varactor diode.

2. A high-frequency signal receiving variable capacitance tuning circuit comprising first varactor diode connected between either one of a receiving end and feeding end and ground, a first tuning coil having one end connected to said receiving end or feeding end, and a second varactor diode having one end connected to the other end of said first tuning coil, and a second tuning coil connected between the other end of said second varactor diode and ground.

3. A tuning circuit according to claim 2, wherein the other end of said second varactor diode is connected to a first switching circuit.

4. A tuning circuit according to claim 3, wherein said second tuning coil has first and second ends, and a second switching circuit is connected between said ends.

5. A tuning circuit according to claim 2, wherein the variable capacitance ratio of said first varactor diode is smaller than that of said second varactor diode.

6. A variable-capacitance tuning circuit for receiving high frequency signals, comprising
    first and second terminals, said second terminal being connected to ground;
    a first varactor diode connected between said first and second terminals;
    a first coil having one end connected to said first terminal; and
    a second varactor diode connected between the other end of said first coil and said second terminal, said first varactor diode having a variable capacitance ratio smaller than that of said second varactor diode.

7. A tuning circuit according to claim 6 which further comprises a second coil interposed between said second varactor diode and said second terminal.

8. A tuning circuit according to claim 7 wherein first switching means is connected between the junction of said second varactor diode and said second coil, said first switching means when closed connecting said junction to said second terminal.

9. A tuning circuit according to claim 8 wherein said second coil is divided into at least two parts, and wherein second switching means is connected between the junction of two of said parts and said second terminal.

* * * * *